United States Patent [19]

Ishihara et al.

[11] Patent Number: 6,161,214
[45] Date of Patent: Dec. 12, 2000

[54] METHOD OF GENERATING DATA ON COMPONENT ARRANGEMENT

[75] Inventors: Yuko Ishihara; Yasuhiro Maenishi, both of Kofu, Japan

[73] Assignee: Matsushita Electric Industrial Co., Ltd., Osaka, Japan

[21] Appl. No.: 09/029,258

[22] PCT Filed: Sep. 6, 1996

[86] PCT No.: PCT/JP96/02537

§ 371 Date: Mar. 6, 1998

§ 102(e) Date: Mar. 6, 1998

[87] PCT Pub. No.: WO97/09684

PCT Pub. Date: Mar. 13, 1997

[30] Foreign Application Priority Data

Sep. 8, 1995 [JP] Japan .................................. 7-231488

[51] Int. Cl.[7] .............................. G06F 17/50; H05K 3/30
[52] U.S. Cl. .................................. 716/8; 703/7; 29/832; 29/834; 29/835; 29/836
[58] Field of Search .............................. 364/468.28, 578; 29/834–836, 739–741; 395/500.09; 700/121, 95–97

[56] References Cited

U.S. PATENT DOCUMENTS

| | | | |
|---|---|---|---|
| 3,654,615 | 4/1972 | Freitag | 340/172.5 |
| 4,704,792 | 11/1987 | Itagaki et al. | 29/741 |
| 4,731,923 | 3/1988 | Yagi et al. | 29/833 |
| 4,805,110 | 2/1989 | Takahashi et al. | 364/468 |
| 4,937,511 | 6/1990 | Herndon et al. | 318/568.21 |
| 5,035,047 | 7/1991 | Harigane et al. | 29/740 |
| 5,079,834 | 1/1992 | Itagaki et al. | 29/840 |
| 5,088,187 | 2/1992 | Takata et al. | 29/705 |
| 5,222,031 | 6/1993 | Kaida | 364/491 |
| 5,247,733 | 9/1993 | Kubota et al. | 29/785 |
| 5,267,176 | 11/1993 | Antreich et al. | 364/491 |
| 5,274,908 | 1/1994 | Suzuki et al. | 29/740 |
| 5,309,371 | 5/1994 | Shikata et al. | 364/491 |
| 5,349,536 | 9/1994 | Ashtaputre et al. | 364/491 |
| 5,355,439 | 10/1994 | Bernstein et al. | 395/82 |
| 5,359,538 | 10/1994 | Hui et al. | 364/491 |
| 5,390,283 | 2/1995 | Eshelman et al. | 395/13 |
| 5,402,564 | 4/1995 | Tsukasaki et al. | 29/832 |
| 5,493,510 | 2/1996 | Shikata | 364/491 |
| 5,531,859 | 7/1996 | Lee et al. | 156/584 |

(List continued on next page.)

OTHER PUBLICATIONS

R. Kumar et al., Assembly Time Optimization for PCB Assembly, American Control Conference, pp. 306–310, Jun. 1994.

Quinn, N.R., Jr.; Breuer, M.A., A Force Directed Component Placement Procedure for Printed Circuit Boards, IEEE Transactions on Circuits and Systems, vol. CAs–26, No. 6, p. 377–388, Jun. 1979.

Kleinhans, J.M.; Sigl, G.; Johannes, F.M.; Antreich, K.J., Gordian: VLSI placement by quadratic programming and slicing optimization, IEEE Transactions on Computer–Aided Design of Integrated Circuits and Systems, pp. 356–365, Mar. 1991.

*Primary Examiner*—Paul R. Lintz
*Assistant Examiner*—A. M. Thompson
*Attorney, Agent, or Firm*—McDermott, Will & Emery

[57] ABSTRACT

A method is presented of generating data on component arrangement capable of shortening the moving distance of the mounting head in an electronic component mounting machine, and enhancing the mounting efficiency.

The distribution center coordinates and their distributed state values of electronic components on a circuit board grouped in accordance with their kind are determined. The arrangement position of each electronic component at a component feed section is determined based on the distribution center coordinates. When the arrangement positions of more than two kinds of electronic components thus determined are the same, the arrangement position of the electronic component having a smaller distributed state value is preferentially determined.

15 Claims, 6 Drawing Sheets

U.S. PATENT DOCUMENTS

| | | | |
|---|---|---|---|
| 5,560,533 | 10/1996 | Maenishi | 228/8 |
| 5,566,078 | 10/1996 | Ding et al. | 364/490 |
| 5,568,636 | 10/1996 | Koford | 395/500 |
| 5,644,500 | 7/1997 | Miura et al. | 364/490 |
| 5,661,663 | 8/1997 | Scepanovic et al. | 364/490 |
| 5,699,265 | 12/1997 | Scepanovic et al. | 364/491 |
| 5,908,282 | 6/1999 | Onodera | 414/783 |
| 6,006,425 | 12/1999 | Fukukura et al. | 29/832 |
| 6,079,096 | 6/2000 | Hata et al. | 29/740 |

METHOD OF GENERATING DATA ON COMPONENT ARRANGEMENT

TECHNICAL FIELD

The present invention relates to a method of generating data on component arrangement at component feed sections in an electronic component mounting machine.

BACKGROUND ART

Figure 1:
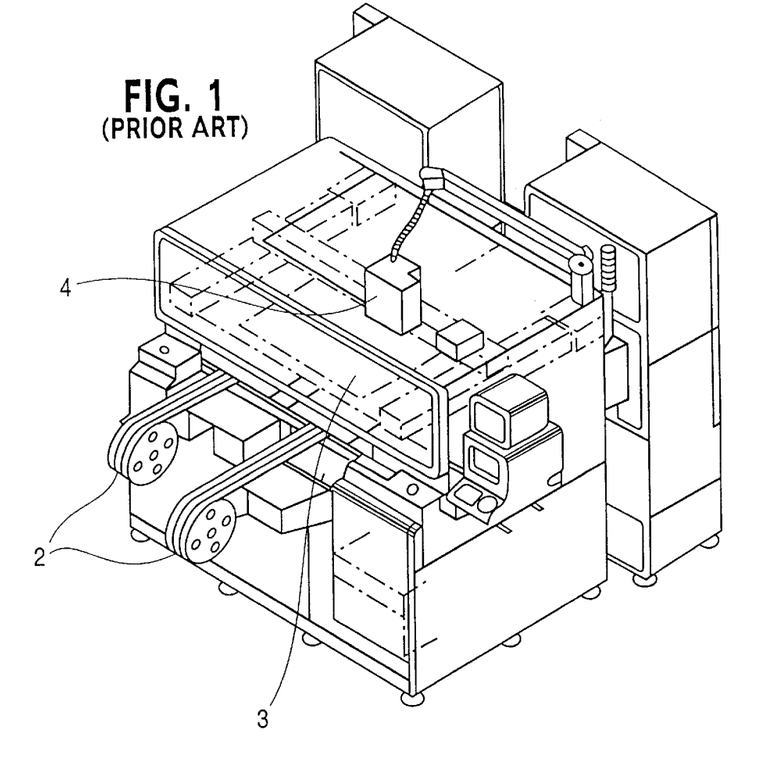
FIG. 1 is a schematic perspective view showing an electronic component mounting machine.
Figure 2:
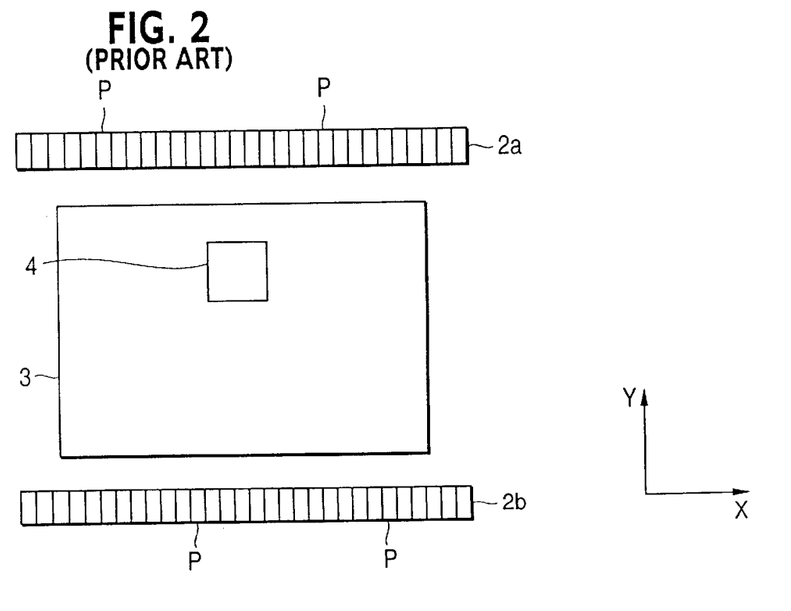
FIG. 2 is a schematic plan view showing the relation of component feed section, circuit board and mounting head.

One type of an electronic component mounting machine is a mounting machine as shown in FIG. 1 and FIG. 2, in which electronic components are supplied from component feed sections 2a, 2b fixed at determined positions, and the electronic components are mounted on a circuit board 3 set at a fixed position by a mounting head 4 composed to move freely in the X and Y directions.

Component feed sections in this type of electronic component mounting machine include component feed sections as shown in FIG. 2, in which a pair of confronting component feed sections 2a, 2b are disposed in the Y direction at an interval, and the X-direction position of each one of the component feed sections 2a, 2b is a component arrangement position p.

Figure 9:
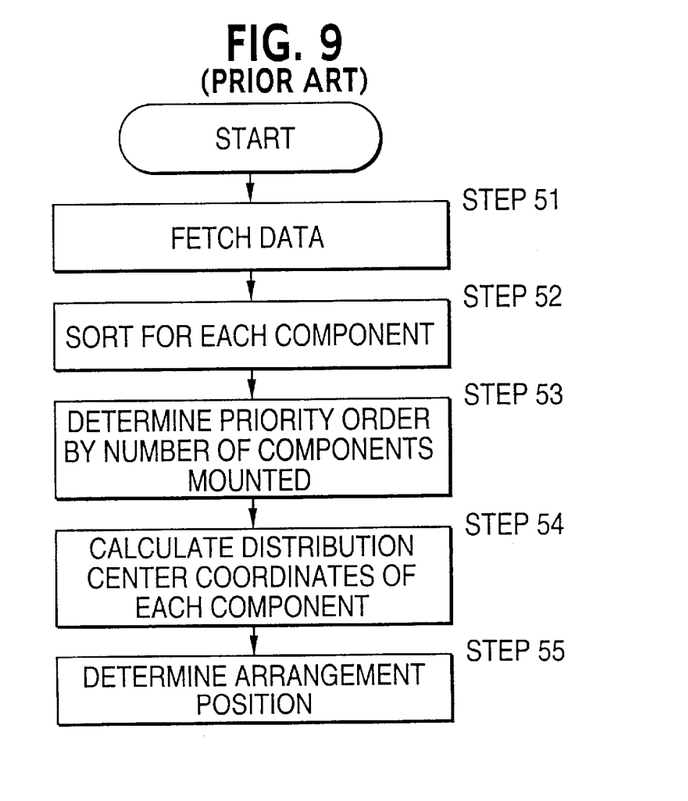
FIG. 9 is a flowchart showing a conventional method of generating data on component arrangement.

In the mounting machine having such component feed sections 2, the arrangement positions of electronic components were determined according to the flow of the prior art shown in FIG. 9.

That is, at step 51, data of all electronic components (including coordinates data of mounting position) to be mounted on a circuit board 3 is fetched. Next, at step 52, the fetched data is sorted into every kind of electronic components based on the name and shape code. At step 53, the electronic components of every kind are rearranged in the sequence of the number of parts to be mounted, and the priority order is determined. At next step 54, distribution center coordinates (X, Y) of electronic components of every kind on the circuit board are determined as the mean of the X-coordinate and the mean of the Y-coordinate on the basis of the coordinates data of each electronic component. At step 55, according to the priority order by the number of parts to be mounted, the arrangement position of each electronic component is determined according to the distribution center coordinates (X, Y). The arrangement position of the electronic component low in the priority order is, if the arrangement position corresponding to the distribution center coordinates (X, Y) has been already assigned, determined at the closest arrangement position in the neighboring blank position.

In the prior art, electronic components of the kind larger in the number of components to be mounted are preferentially assigned with the arrangement position, and the preferentially assigned position is based on the distribution center coordinates. Accordingly, the prior art has a certain rationality for shortening the required moving distance of the mounting head. However, the following problem was involved when determining the priority order of arrangement position among electronic components nearly same in the number of components to be mounted. That is, when the distribution center coordinates are nearly same and the arrangement position is identical, supposing one kind is slightly larger in the number of components to be mounted but has a wide distributed state of mounting positions of the electronic components belonging to the same kind, while the other is slightly smaller in the number of components to be mounted but is mutually close in the mounting positions of electronic components belonging to the same kind and hence narrow prior has a distributed state, in the prior art, the arrangement position is preferentially determined for the electronic components belonging to the kind having a wider distributed state. When the arrangement position is determined in this way, it is general that the effect is larger in the distributed state than in the number of components to be mounted, and as a result, as compared with the case of determining oppositely, the moving distance of the mounting head is longer, and the mounting efficiency is lowered.

DISCLOSURE OF THE INVENTION

In the light of the above problems, the first invention of the present application provides a method of generating data on component arrangement, which is a method of generating data on component arrangement in a mounting machine for mounting an electronic component supplied from a component feed section fixed at a determined position on a circuit board set at a fixed position by a mounting head composed to move freely, in which the distribution center coordinates and distributed state values of electronic components on a circuit board grouped in accordance with their kind are determined, the arrangement position of each electronic component at a component feed section is determined based on the distribution center coordinates, and when the arrangement positions of more than two kinds of electronic components thus determined are the same, the arrangement position of the electronic component having a smaller distributed state value is preferentially determined. The second invention of the present application provides a method of generating data on component arrangement, being a method of generating data on component arrangement in a mounting machine for mounting an electronic component supplied from a component feed section fixed at a determined position on a circuit board set at a fixed position by a mounting head composed to move freely, in which the distribution center coordinates of electronic components on a circuit board assorted in accordance with their kind are determined, the arrangement position of each electronic component at a component feed section is determined based on the distribution center coordinates, and when the arrangement positions of two kinds of electronic components thus determined are the same, by simulating the mounting when each electronic component is mounted at the same arrangement position and a substitute arrangement position, each moving distance is determined, the difference in the moving distance is determined by replacing the arrangement position of each electronic component, and the arrangement position of the electronic component having a smaller difference in the moving distance is preferentially determined.

BEST MODE FOR CARRYING OUT THE INVENTION

To solve the above problems, in the first invention of the present application, in the process of determining the arrangement position of each electronic component at a component feed section on the basis of the distribution center coordinates, when the arrangement positions of more than two kinds of electronic components are the same, the arrangement position of the electronic component having a smaller distributed state value is preferentially determined. In this constitution, as compared with a case of determining the arrangement position of the electronic component oppositely, the moving distance of the mounting head is often shorter, and hence the mounting efficiency may be enhanced.

In the second invention of the present application, in the process of determining the arrangement position of each electronic component at a component feed section on the basis of the distribution center coordinates, when the arrangement positions of two kinds of electronic components are the same, by simulating the mounting when each electronic component is mounted at the same arrangement position and a substitute arrangement position, each moving distance is determined, the difference in the moving distance is determined by replacing the arrangement position of each electronic component, and the arrangement position of the electronic component having a smaller difference in the moving distance is preferentially determined. In this constitution, as compared with a case of determining the arrangement position of the electronic component oppositely, the moving distance of the mounting head is often shorter, and hence the mounting efficiency may be enhanced.

In the second invention, same as in the first invention, it is intended to shorten the moving distance of the mounting head depending on the distributed state, but not limited to the distributed state alone, it is also possible to consider other factors such as the number of components to be mounted. Hence, as compared with the first invention, the arrangement positions of components can be determined more rationally.

Referring now to the drawings, embodiments of the invention are described in detail below.

FIRST EMBODIMENT

FIG. 1 and FIG. 2 show an electronic component mounting machine to which the method of the invention is applied, component feed sections 2a, 2b, a circuit board 3, and a mounting head 4. They are same as explained above. In FIG. 1, reference numeral 2 is a component feed cassette for feeding components to the component feed sections 2a, 2b.

Figure 3:
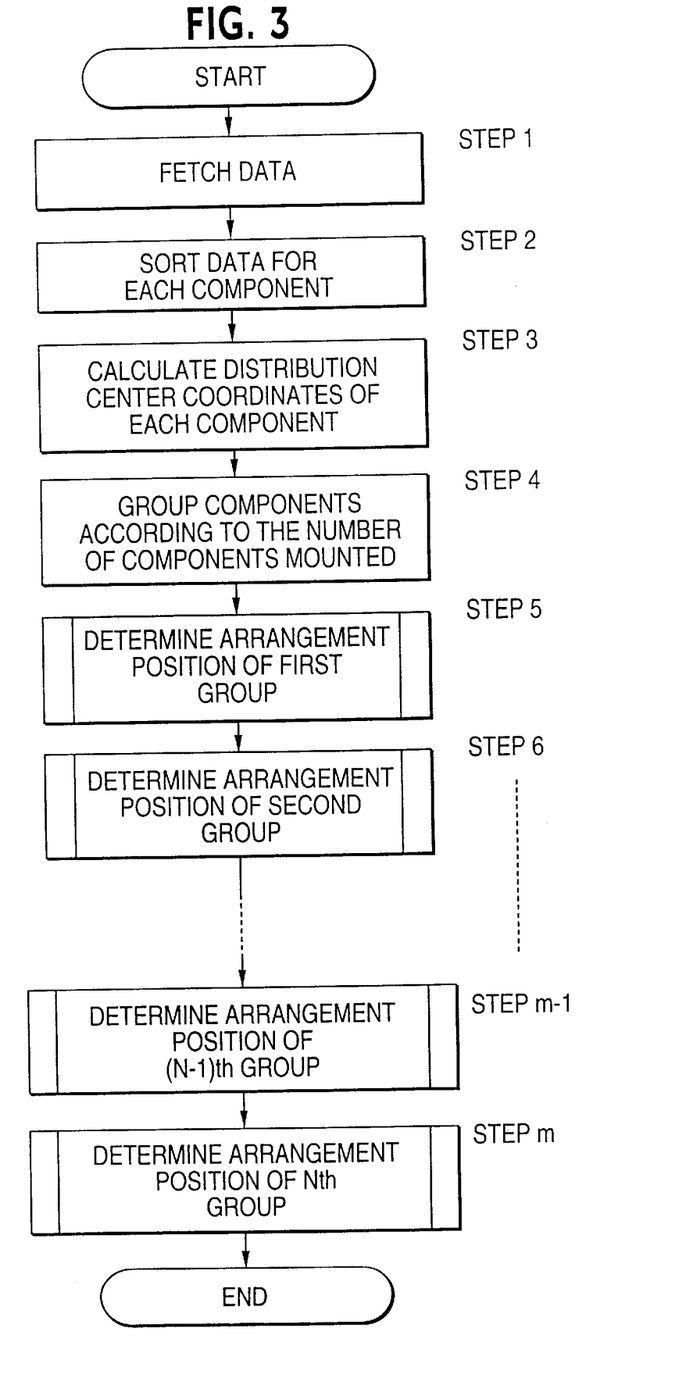
FIG. 3 is a flowchart of a method of generating data on component arrangement in an embodiment of the invention.

FIG. 3 is a flowchart showing a method of generating data on component arrangement in this embodiment. As shown in this flowchart, at step 1, data of all electronic components (including coordinates data of mounting position) to be mounted on a circuit board 3 is fetched. Next, at step 2, the fetched data is sorted into every kind of electronic components based on the name and shape code. At step 3, distribution center coordinates (X, Y) of electronic components on the circuit board are determined as the mean of the X-coordinate and the mean of the Y-coordinate on the basis of the coordinates data of each electronic component. At step 4, electronic components of each kind are rearranged in the sequence of the number of components to be mounted, and grouped into a first group with the maximum number of components to be mounted, a second group of the next largest number, . . . , and an Nth group with the minimum number. For example, a group with 25 or more components to be mounted is the first group, a group with 24 to 20 components to be mounted is the second group, . . . , a group with four to two components to be mounted is the (N−1)th group, and a group with one component to be mounted is the Nth group. At step 5, the component arrangement position in the first group with the maximum number of components to be mounted is determined. At step 6, among the positions excluding the component arrangement position determined at step 5, the component arrangement position in the second group having the second largest number of components to be mounted is determined. At step m−1 and step m, the component arrangement positions of the (N−1)th group and Nth group are determined respectively.

The invention is applied in determining the component arrangement position within the group in the groups with relatively large number of components to be mounted such as the first group with the maximum number of components to be mounted and the second group with the second largest number, and the detail is described below. On the other hand, in the Nth group with the smallest number of components to be mounted and other groups with relatively small number of components to be mounted, the priority order for determining the component arrangement position is determined by the order of number of components to be mounted and the predetermined priority order by the kind. For example, in the Nth group with only one component to be mounted, the priority order of determining the component arrangement position is the predetermined priority order by the kind, and in the remaining arrangement positions excluding the arrangement positions determined at step 5 to step m−1, the arrangement positions of electronic components are sequentially determined so as to be closest to the coordinates position on the circuit board (in this case, coinciding with the distribution center coordinates) according to the priority order.

Figure 4:
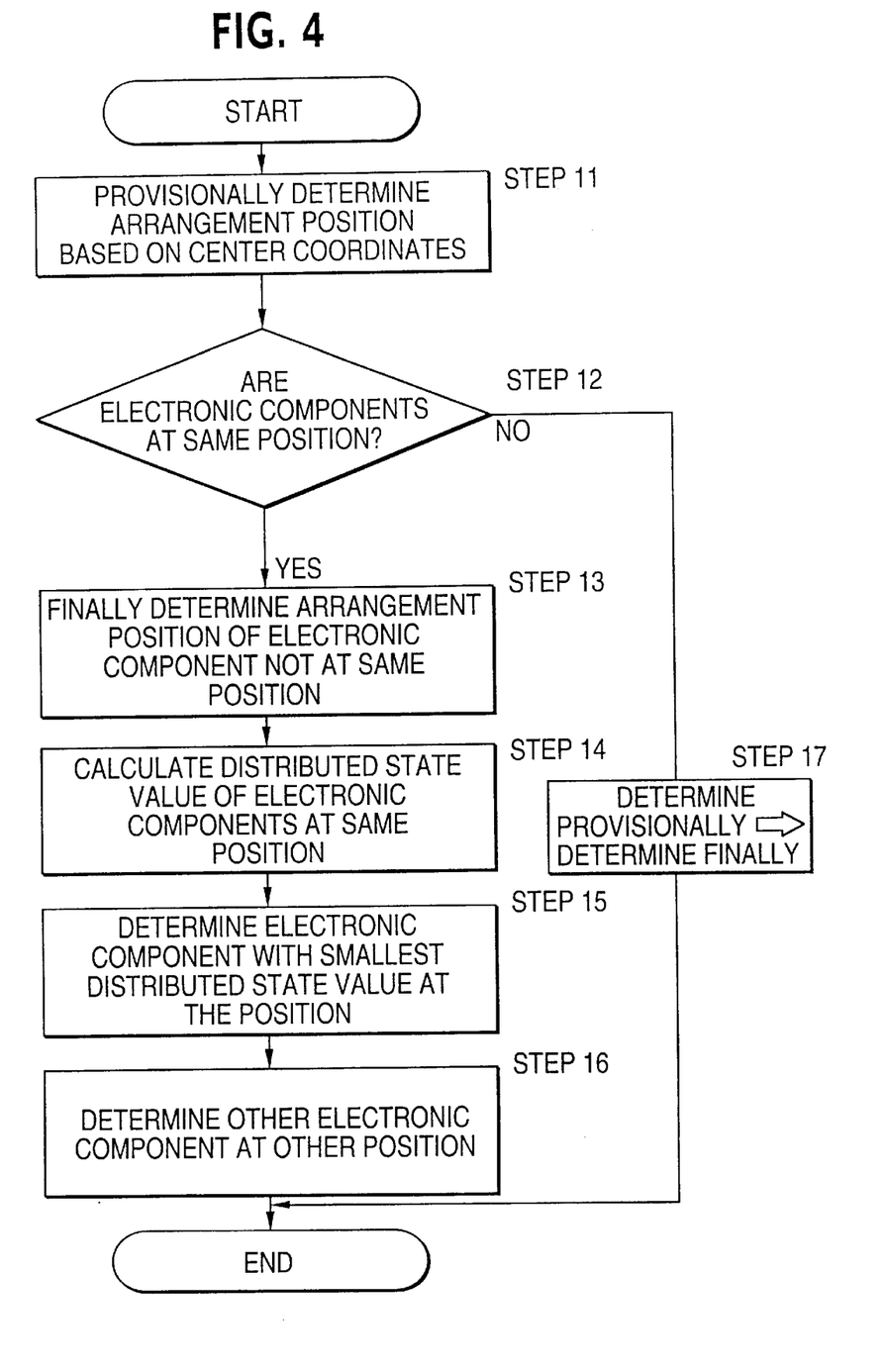
FIG. 4 is a flowchart showing essential parts of the method of generating data on component arrangement in the embodiment of the invention.
Figure 5:
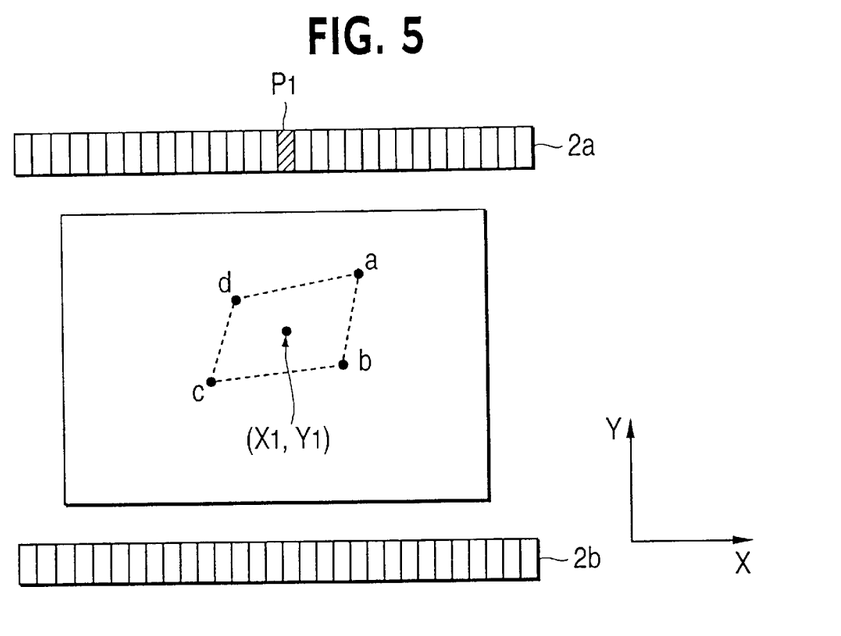
FIG. 5 is a schematic plan view showing the operation of an electronic component mounting machine in the embodiment of the invention.

FIG. 4 specifically shows the method of determining the component arrangement position in the first group. As shown in the flowchart in FIG. 4, at step 11, the arrangement position of electronic components of each kind belonging to the first group is provisionally determined according to the distribution center coordinates (X, Y). For example, as shown in FIG. 5, when the arrangement positions of certain electronic components are a to d (in the drawing, only four parts are mounted for the sake of simplicity, but generally more components are mounted, which is same as in FIG. 6 below), and the distribution center coordinates are (X1, Y1), the component feed section 2a closer to Y1 on the Y-coordinate is selected, and the arrangement position p1 closest to X1 on the X-coordinate is provisionally determined as the arrangement position for this component on the component feed section 2a.

Whether thus provisionally determined arrangement position is duplicated between electronic components or not is determined at step 12. In this case, if there is no other electronic component at the same position, at step 17, the provisional determination is the final determination, and the arrangement position of all electronic components of the first group is determined.

On the other hand, if the provisionally determined arrangement position is duplicated among electronic components, at step 13, first, in the electronic component not duplicating with others, the provisionally determined arrangement position is determined as the final position. Among the electronic components provisionally determined at the remaining same arrangement positions, the arrangement position among the electronic components is determined at step 14, by calculating the distributed state value, and the electronic component with the smallest distributed state value is determined by priority at step 15 to fix the provisional position as the final position, and at step 16, the electronic component of the next smallest distributed state value is selected from the remaining arrangement positions, so as to be closest to the distribution center coordinates, and the arrangement position is finally determined, and thereafter the arrangement position is finally determined similarly.

Figure 6:
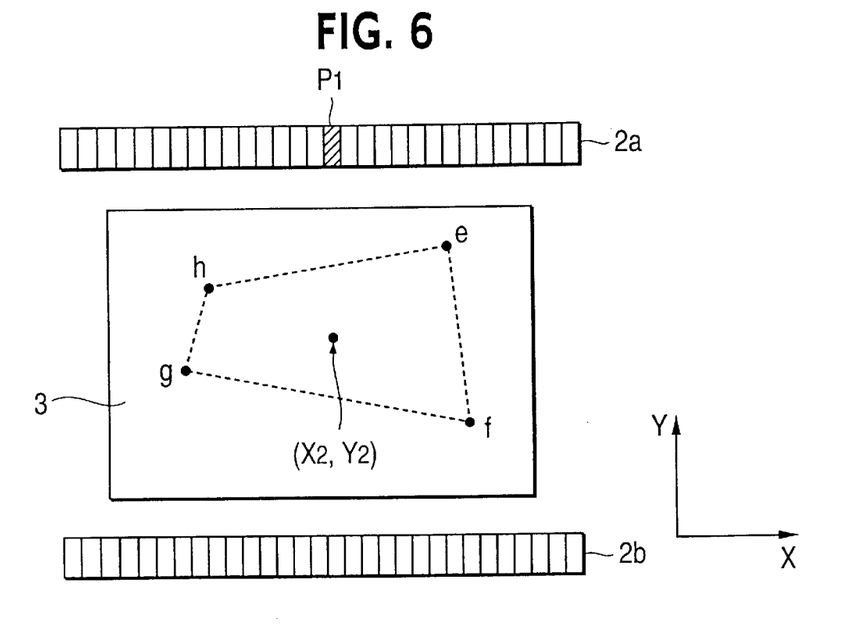
FIG. 6 is a schematic plan view showing the operation of an electronic component mounting machine in the embodiment of the invention.

For example, when the electronic component of which distribution center coordinates are (X1, Y1) at mounting positions a to d in FIG. 5 and the electronic component of which distribution center coordinates are (X2, Y2) at mounting positions e to h in FIG. 6 are provisionally determined at the same arrangement position p1, the distributed state value is determined in the following formula (1), and the electronic component having the smaller distributed state value a (specifically the one shown in FIG. 5) is finally determined at the arrangement position p1, while the electronic component having the larger distributed state value α (specifically the one shown in FIG. 6) is finally determined at another position.

$$\alpha = \frac{\overline{AO} + \overline{BO} + \ldots + \overline{NO}}{n} \quad (1)$$

where $\overline{AO}, \overline{BO}, \ldots, \overline{NO}$ are lengths of line segments linking between mounting positions, A, B, . . . , N and the distribution center coordinate point O, n is the number of components to be mounted.

As the distributed state value, aside from α shown in formula (1), the sum β of the line segments shown in formula (2) may be also used.

$$\beta = \overline{AO} + \overline{BO} + \ldots + \overline{NO} \quad (2)$$

Alternatively, as the distributed state value, a polygonal area enclosed by mounting positions A, B, . . . , N can be also employed.

In this example, as the arrangement position of the electronic component, the X-coordinate and Y-coordinate are determined simultaneously, but it is also possible to determine the X-coordinate and Y-coordinate individually. At this time, when determining the arrangement position, the priority may be given to the one smaller in the distributed state value in the X-coordinate and Y-coordinate individually. As the distributed state values σx, σy, preferably, formula (3) and formula (4) should be used.

$$\sigma_x = \sqrt{\frac{(A_x - X_o)^2 + (B_x - X_o)^2 + \ldots + (N_x - X_0)^2}{n}} \quad (3)$$

$$\sigma_y = \sqrt{\frac{(A_y - Y_o)^2 + (B_y - Y_o)^2 + \ldots + (N_y - Y_0)^2}{n}} \quad (4)$$

where $A_x, B_x, \ldots, N_x$ are X-coordinates of mounting positions A, B, . . . , N, $A_y, B_y, \ldots, N_y$ are Y-coordinates of mounting positions A, B, . . . , N, $X_o$ is the X-coordinate of the distribution center, $Y_o$ is the Y-coordinate of the distribution center, and n is the number of components to be mounted.

Also in the groups relatively large in the number of components to be mounted after the second group at steps 6, 7, . . . shown in FIG. 3, the component arrangement position within the group is determined according to the flowchart shown in FIG. 4.

SECOND EMBODIMENT

Other embodiment of determination of arrangement position of the first group at step 5 in FIG. 3 is described below while referring to the flowchart in FIG. 7. The process from step 1 to step 4 is same as in the first embodiment.

Figure 7:
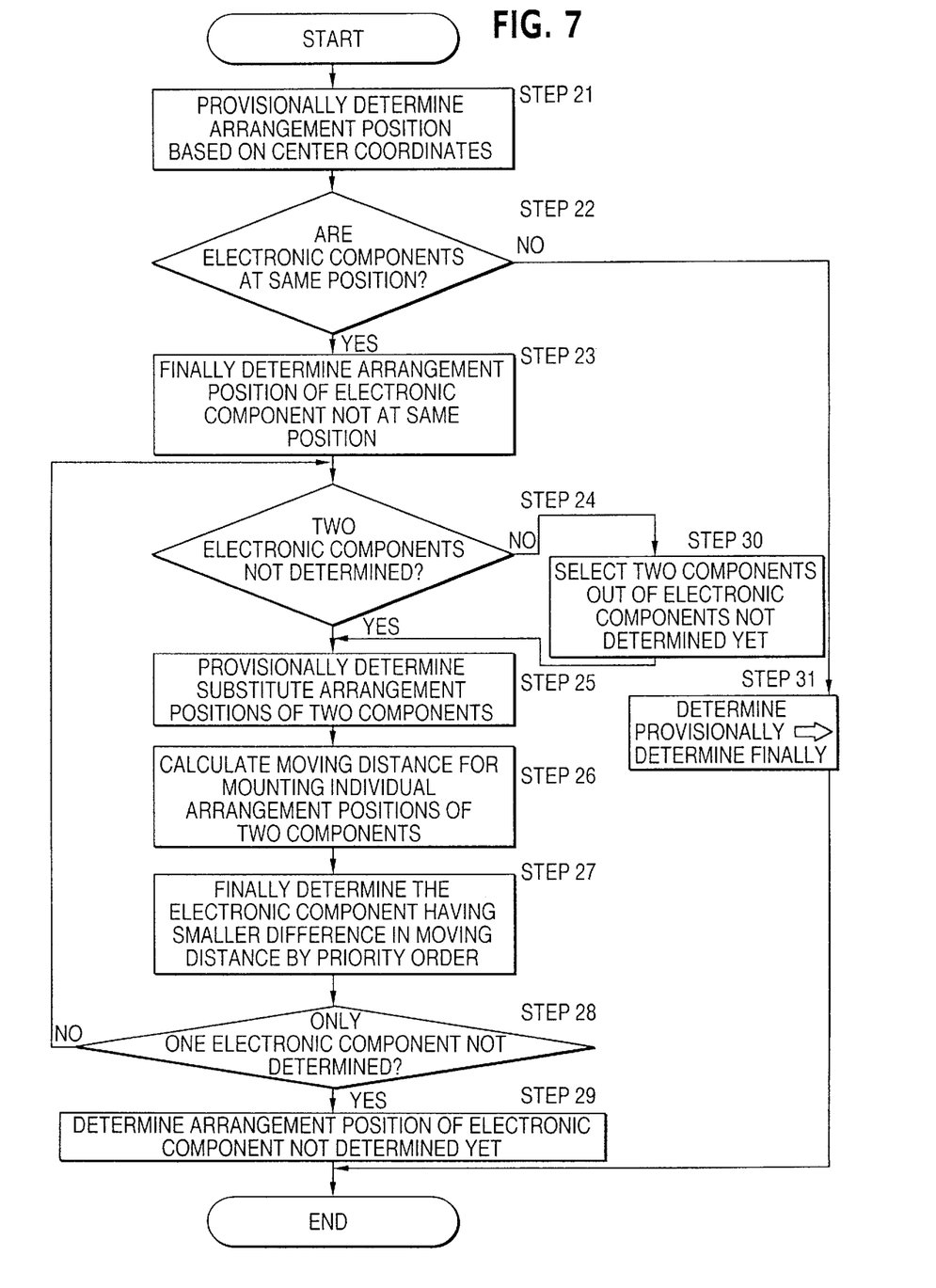
FIG. 7 is a flowchart showing essential parts of a method of generating data on component arrangement in other embodiment of the invention.

As shown in the flowchart in FIG. 7, at step 21, the arrangement position of all electronic components belonging to the first group is provisionally determined on the basis of the distribution center coordinates (X, Y). At next step 22, it is determined whether the provisionally determined arrangement position is duplicated among the electronic components or not, and if the electronic components are duplicated at the same position, at step 31, the provisional position is finally determined, and all electronic components of each kind of this first group are determined in the arrangement position.

Figure 8:
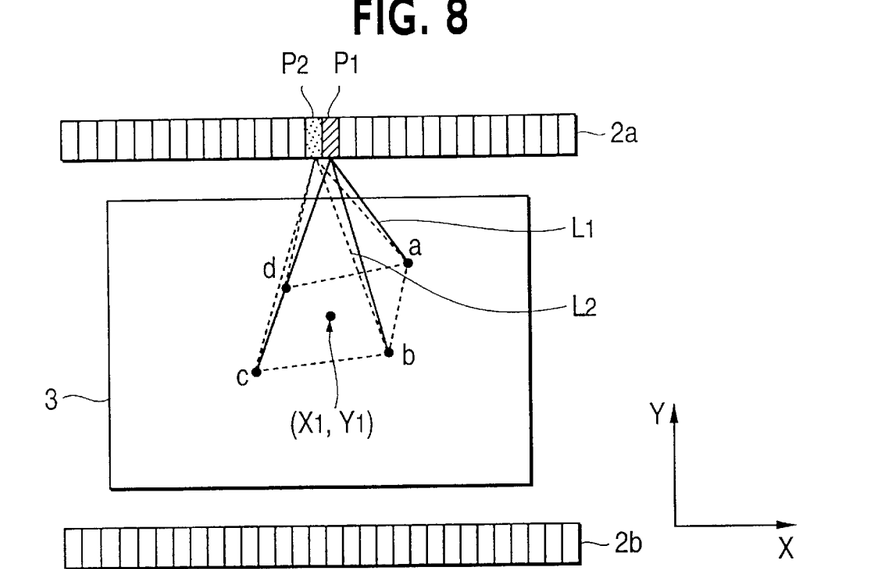
FIG. 8 is a schematic plan view showing the operation of an electronic component mounting machine in the other embodiment of the invention.

On the other hand, if the provisionally determined arrangement position is duplicated among electronic components, at step 23, first, in the electronic component not duplicating with others, the provisionally determined arrangement position is determined as the final position. At next step 24, among the electronic components duplicated in the provisionally determined positions, it is determined whether the number of electronic components duplicated in the same provisionally determined position is two components only or three components or more. If three or more electronic components are duplicated in the same provisionally determined position, at step 30, two components thereof are determined by priority. At this time, the priority order is determined by the number of components to be mounted and the predetermined priority order by kinds. When the number of duplicated electronic components is determined to be two at step 24, or when two components are selected at step 30, at next step 25, substitute arrangement positions of these two components are provisionally determined. As shown in FIG. 8, the first arrangement position p1 is already determined provisionally on the basis of the distribution center coordinates, and in addition, a second arrangement position p2 closest to the first arrangement position p1 among the remaining arrangement positions is provisionally determined as the substitute arrangement position.

At next step 26, as shown in FIG. 8, by mounting simulation in the case of setting the first electronic component with mounting points a to d and distribution center coordinates (X1, Y2) at the first arrangement position p1, the moving distance L1 of the mounting head is determined, and then by mounting simulation in the case of setting the first electronic component at the second arrangement position p2, the moving distance L2 of the mounting head is determined, and the difference in the moving distance ΔL (=L2−L1) is determined. Similarly, as for the second electronic component (not shown), the moving distances L1, L2 and moving distance difference ΔL are determined. At the next step, step 27, comparing the difference ΔL of the moving distance between the first and second components, the arrangement position of the electronic component of the smaller difference ΔL in the moving distance is finally determined in the first arrangement position p1.

At step 28, among the duplicated electronic components, it is determined whether the electronic component not determined in the arrangement position is one component or not. If the number of duplicated electronic components is determined to be two at step 24, the number of electronic components not determined is determined to be, of course, one. Accordingly, at step 29, the arrangement position of the electronic component larger in the difference ΔL in the moving distance is finally determined at the second arrangement position p2.

If the number of duplicated electronic components is judged to be three or more at step 24, the number of electronic components not determined is determined to be two or more. Accordingly, only the arrangement position of the electronic component smaller in the difference ΔL in the moving distance is finally determined, while the arrangement position of the electronic component larger in the difference ΔL in the moving distance is not determined, and the process returns to step 24. After returning to step 24, among the electronic component large in the difference ΔL in the moving distance and the remaining electronic components, their arrangement positions are determined in the process of the same steps as described above.

In the groups relatively large in the number of components to be mounted in the second and subsequent groups at steps 6, 7, . . . shown in FIG. 3, the component arrangement position within the group can be determined on the basis of the flowchart in FIG. 7.

Industrial Applicability

Thus, according to the invention, in the process of determining the arrangement positions of electronic components at component feed sections on the basis of the distribution center coordinates of the mounting positions on the circuit board, the arrangement positions can be determined rationally in consideration of the distributed state of the mounting positions. Hence, the moving distance of the mounting head is shortened, and the mounting efficiency can be enhanced.

Reference Numerals

2a, 2b Component feed section
3 Circuit board
4 Mounting head

What is claimed is:

1. A method of generating data on component arrangement of a component feed section in a mounting machine for mounting an electronic component, which is supplied from the component feed section fixed at a determined position, onto a circuit board set at a fixed position by a mounting head composed to move freely, the method comprising the steps of:

determining the distribution center coordinates and distributed state values for each kind of electronic component that are grouped in accordance with their kind;

determining the arrangement position of each electronic component at a component feed section based on the distribution center coordinates; and preferentially determining the arrangement position of the electronic component having a smaller distributed state value, when the arrangement positions of more than two kinds of electronic components thus determined are the same.

2. A method of generating data on component arrangement in a mounting machine for mounting an electronic component, which is supplied from a component feed section fixed at a determined position, onto a circuit board set at a fixed position by a mounting head composed to move freely, the method comprising the steps of:

determining the distribution center coordinates for each kind of electronic component that are grouped in accordance with their kind;

determining the arrangement position of each electronic component at a component feed section based on the distribution center coordinates; and when the arrangement positions of two kinds of electronic components thus determined are the same, determining each moving distance, by simulating the mounting when each electronic component is positioned at the same arrangement position and a substitute arrangement position;

determining the difference in the moving distance between said same arrangement position and said substitute arrangement position of each electronic component; and preferentially determining the arrangement position of the electronic component having a smaller difference in the moving distance.

3. The method of claim 1, wherein a kind of electronic component having a smaller distributed state value than other kinds of electronic components preferentially determined is placed at said arrangement position located at the shortest distance in the distribution center coordinates of the preferentially determined kind of electronic component.

4. The method of claim 1, wherein said distributed state value for each one of said kinds of electronic components is the sum of the distance between the distribution center coordinates for each kind of electronic component and each mounting position.

5. The method of claim 1, wherein said distributed state value for each one of said kinds of electronic components is the polygonal area enclosed by each mounting position of said each kind of each electronic component.

6. The method of claim 1, wherein said kinds of electronic components are classified into groups in the order of the greater number of mounting positions thereof, and said arrangement position is determined preferentially for the group having a smaller distributed state value than other kinds of electronic components in a group having the greater number of mounting positions.

7. A method of mounting a plurality of electronic components onto a circuit board from a component feed section by a mounting head, said plurality of electronic components including plural kinds of components, each of said plural kinds of components including a plurality of same-kind-components, said component feed section having a plurality of arrangement positions, each of said plurality of same-kind-components being supplied to each one of said plurality of arrangement positions, said mounting method comprising the steps of:

(a) determining said arrangement position of each of said kinds of components, said step of determining said arrangement position including;

(1) determining a distribution center coordinate and a distributed state value for each of said plural kinds of components, (2) predetermining a provisional arrangement position of said each of said kinds of components by said distribution center coordinate, (3) checking whether or not said provisional arrangement position of more than two kinds of components are the same, and (4) when a result of checking is that said provisional arrangement position of more than two kinds of components are the same, preferentially determining said arrangement position of said each of said plural kinds of components so that a kind of components having a smallest distributed state value are placed in said provisional arrangement position of said plurality of arrangement positions, (b) supplying each of said neural kinds of components from said each arrangement position which is determined by said step of (a), and (c) mounting said plurality of components supplied in said each arrangement position onto said circuit board.

8. The mounting method of claim 7, wherein said step (4) includes the steps of:

determining each moving distance of said mounting head between said provisional arrangement position and a mounting position, by simulating the mounting when each electronic component is positioned at the same arrangement position and a substitute arrangement position, determining the difference in the moving distance by replacing the arrangement position of each electronic component, and preferentially determining the arrangement position of the electronic component having a smaller difference in the moving distance.

9. The mounting method of claim 7, wherein said step (a) further includes the step of (5) determining a remaining arrangement position of each of said kinds of components so as that other kinds of components having a next smallest distributed state value are placed in another provisional arrangement position so as to be closest to a distribution center coordinate of said other kinds of components.

10. The mounting method of claim 7, wherein said distribution center coordinates are determined by X, Y-coordinates having respective X-coordinates and respective Y-coordinates for a schematic plan view of said component feed section, said circuit board, and said mounting head.

11. The mounting method of claim 10, wherein said component feed section has a first feed section disposed at a first side of said circuit board and a second feed section disposed at a second side of said circuit board on said Y-coordinate, and at said step (4), said provisional arrangement position, that said kinds of components having the smallest distributed state value are placed, is determined so as to be placed at the side closer to said distribution center coordinates.

12. The mounting method of claim 7, wherein a kind of electronic component having a distributed state value smaller than other kinds of electronic components preferentially determined is placed at said arrangement position located at the shortest distance in the distribution center coordinates of the preferentially determined kind of electronic component.

13. The mounting method of claim 7, wherein said distributed state value for each one of said kinds of components is the sum of the distance between the distribution center coordinates for each of said kinds of components and each mounting position.

14. The mounting method of claim 7, wherein said distributed state value for each one of said kinds of electronic components is the polygonal area enclosed by each mounting position of said each kind of said electronic component.

15. The mounting method of claim 7, wherein said kinds of electronic components are classified into groups in the order of the greater number of mounting positions thereof, and said arrangement position is determined preferentially for the group having a smaller distributed state value than other kinds of electronic components in a group having the greater number of mounting positions.

* * * * *